US007247918B2

(12) United States Patent
Tateyama

(10) Patent No.: US 7,247,918 B2
(45) Date of Patent: Jul. 24, 2007

(54) MOS CAPACITOR TYPE SEMICONDUCTOR DEVICE AND CRYSTAL OSCILLATION DEVICE USING THE SAME

(75) Inventor: Yuichi Tateyama, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 112 days.

(21) Appl. No.: 11/242,000

(22) Filed: Oct. 4, 2005

(65) Prior Publication Data
US 2006/0081892 A1    Apr. 20, 2006

(30) Foreign Application Priority Data
Oct. 14, 2004    (JP)    ............... 2004-300166

(51) Int. Cl.
*H01L 31/113*    (2006.01)
*H01L 29/94*    (2006.01)
*H01L 21/336*    (2006.01)

(52) U.S. Cl. ...................................... 257/401; 438/288

(58) Field of Classification Search ................ 438/280, 438/283, 288, 292; 257/341, 343, 390, 401
See application file for complete search history.

(56) References Cited

U.S. PATENT DOCUMENTS 6,140,687 A * 10/2000 Shimomura et al. ........ 257/401

FOREIGN PATENT DOCUMENTS

JP    10-214971    8/1998

* cited by examiner

*Primary Examiner*—Calvin Lee
(74) *Attorney, Agent, or Firm*—McDermott Will & Emery LLP

(57) ABSTRACT

A compact semiconductor device forming a capacitive element for high frequencies that allows good capacitance change to be achieved is provided. AMOS capacitor type semiconductor device includes a gate electrode formed on a surface of a substrate through a gate insulating film, source/drain regions provided to have the gate electrode therebetween, and a back gate including a contact diffusion region for contacting the substrate. Voltage applied across the regions between the source or drain region and the gate electrode and between the gate electrode and the back gate is adjusted, so that charge accumulated at the gate insulating film can be adjusted. In the device, the distance between the source and drain regions or the distance between the back gate and the gate electrode is determined so that electrons or holes can be accumulated at the interface between the gate insulating film and the substrate within a cycle of the applied voltage.

13 Claims, 10 Drawing Sheets

MOS CAPACITOR TYPE SEMICONDUCTOR DEVICE AND CRYSTAL OSCILLATION DEVICE USING THE SAME

BACKGROUND OF THE INVENTION

1. Field of the Invention

The present invention relates to a MOS capacitor type semiconductor device and a crystal oscillation device using such a device, and more particularly, to a semiconductor device that forms a capacitor in a MOS structure.

2. Description of the Related Art

In recent years, mobile communication equipment such as mobile phones has rapidly been improved, and there has been a demand for various additional functional improvements in the communication equipment such as further reduction in size and operation at higher frequencies. Therefore, there has been a demand for a more compact crystal oscillation device capable of operating at higher frequencies since the frequency of the crystal oscillation device is used as a standard communication frequency.

In order to reduce the size of the crystal oscillation device and to enable the device to carry out high frequency operation, a crystal oscillator must be associated with the oscillation frequency. High frequency operation can be achieved to some extent when an equivalent circuit constant for the crystal oscillator is changed by selecting a crystal orientation for use and when the design of the electrode such as the pitch of electrodes formed on the surface of the crystal and the impedance is changed. However, such change could give rise to a drop in the frequency sensitivity, which leads to degradation in the characteristic, and therefore the drop in the frequency sensitivity must be compensated for by the oscillation circuit portion.

In the oscillation circuit using such a crystal oscillator, in order to allow the high frequency operation to be achieved while solving the problem of the drop in the frequency sensitivity, the minimum and maximum values for the capacitance value that serves as a load for the crystal oscillator are increased, so that the width of frequency change can be increased.

It has been known that the characteristic of the oscillation circuit can be improved by using a capacitor formed by a junction of P and N type semiconductors, a variable capacitor with switchable capacitance (hereinafter referred to as "switching capacitor") or an additional capacitor such as a MOS capacitor for increasing the width of frequency change.

In order to increase the width of capacitance change in the junction of the P and N type semiconductors, the P and N type carrier concentrations must be changed to change the junction capacitance, but as the concentration difference increases, variations in the absolute capacitance value increase.

Among the above described capacitors, the use of the switching capacitor requires an excessive switching capacitance in order to increase the width of capacitance change, and the switching capacitance value and the area of the switching element must be increased.

When a MOS capacitor is used, the width of change in the capacitance between the electrodes must be increased, and therefore an excessive area is necessary as with the case of the switching capacitor, but the area of the elements can be reduced as compared to the case of using the switching element. However, the high frequency characteristic is degraded.

For example, as shown in FIG. 10, a typical conventional MOS capacitor type semiconductor device includes a silicon substrate (or a well formed on the surface of a silicon substrate) 37, a source region 38 and a drain region 39 having a gate electrode 35 between them, and a back gate 34 with a contact diffusion region 40 therearound. There are a source line 31, a gate line 32, a drain line 33, and a back gate line 34. The potentials between these lines are controlled, so that the capacitance is accumulated and changes at a gate oxide film 36 formed between the gate electrode 35 and the silicon substrate 37.

In a proposed device, in order to improve the overall high frequency characteristic such as the maximum oscillation frequency, a ring-shaped gate electrode is formed on an active region, a drain region is formed in a region on the inner side of the gate electrode in the active region, a source region is formed in a region on the outer side of the gate electrode, and a gate extension line connected to the gate electrode is extended from the top of the source region onto the element isolation region. In this way, a good high frequency characteristic results (see for example Japanese Patent Laid-Open No. H10-214971).

When however a MOS transistor capable of operating at a high frequency corresponding to the maximum oscillation frequency is used to generate a capacitance change between the electrodes, an excessive area is necessary. This is not suitable when a capacitor is used to form an oscillator and could even degrade the oscillator characteristic rather than improving it.

The frequency characteristic of a MOS capacitor type semiconductor device that can be reduced in size and operated at high frequencies is defined as follows depending on the frequency and the structure of electrodes for use.

(1) Using the Capacitance Value Between the Gate and Source (Drain)

The moving distance of electrons as carriers (diffusion length) in the cycle defined by the moving speed of the electrons can be expressed by the following expression:

$$\text{The moving distance of electrons: } Ln = \text{sqrt}(Dn \times \tau_n)$$

where Dn is the diffusion coefficient of holes and $\tau_n$ is the cycle of a frequency for use [s].

When voltage is applied to cause the gate to be positively biased, electrons are supplied from the drain and source, and accumulated at the $SiO_2$/Si interface between the gate oxide film of $SiO_2$ and the substrate of Si. At the time, when the source-drain distance L is large, electrons as minority carriers moving by diffusion cannot reach the central part, and the capacitance value is reduced. More specifically, as can be seen from the result of measuring the capacitance change in response to the change in the gate voltage in FIG. 5, a sufficient sensitivity characteristic is shown about at a frequency of 100 kHz, but the sensitivity characteristic is greatly lowered at about 20 MHz.

This is probably because as the frequency for use is higher, the moving distance is shorter, and electrons do not reach the central part. Therefore, for operation in a high frequency domain, the actual source-drain distance L must be not more than the moving distance Ln of electrons (Ln dependency).

(2) Using the Capacitance Between the Gate and the Back Gate

When voltage is applied to negatively bias the gate, holes are supplied from the electrode of the back gate and accumulated at the $SiO_2$/Si interface.

The moving distance (diffusion length) of holes as carriers in the cycle defined by the moving speed of the holes is expressed by the following expression:

The moving distance of holes within one cycle:
$$Wp=\text{sqrt}(Dp \times \tau_p)$$

where Dp is the diffusion coefficient of electrons, and $\tau_p$ is the cycle of the frequency for use [s].

When the distance between the gate and the back gate, in other words the distance $L_{BG}$ between the gate end and a contact diffusion region 40 for contacting the back gate is large, the moving holes as they diffuse in the back gate do not reach the end, and the capacitance value is small. More specifically, as can be seen from the result of measuring the capacitance change with the back gate when the gate voltage is changed in FIG. 6, a sufficient sensitivity characteristic is shown about at a frequency of 100 kHz, but the sensitivity characteristic is greatly lowered at a high frequency of 20 MHz.

More specifically, when the frequency for use is higher, the moving distance is shorter, and the holes do not reach the gate end. Therefore, for high frequency operation, the actual distance $L_{BG}$ between the gate and the back gate must be equal to or less than the moving distance Wp of holes (Wp dependency).

SUMMARY OF THE INVENTION

The present invention is directed to the above described problems, and it is an object of the invention to provide a semiconductor device that forms a compact capacitive element for high frequency operation that allows good capacitance changes to be obtained, while keeping the width of frequency change from being lowered.

According to the invention, electrons or holes are reversed in the moving direction as they move by adjusting their distances from various regions, and as the layout is improved in this way, a semiconductor device capable of operating at high frequencies with no problems is provided.

More specifically, a MOS capacitor type semiconductor device according to the invention includes a gate electrode formed on a surface of a substrate through a gate insulating film, source/drain regions provided to have the gate electrode between them, and a back gate having a contact diffusion region for contacting the substrate. Voltage applied between the source/drain region and the gate electrode or between the gate electrode and the back gate is adjusted, so that charge accumulated at the gate insulating film can be adjusted. The distance between the source and drain regions or the distance between the back gate and the gate electrode is determined so that electrons or holes can be accumulated at the interface between the gate insulating film and the substrate within a cycle of a frequency superposed to the applied voltage.

In this way, if the operating frequency is high, the moving distance is shorter, and electrons or holes do not reach the end of the gate, the potential can be prevented from being inverted and therefore the device can be used at high frequencies. Particularly preferably, the distances are determined so that electrons or holes are accumulated to a substantially saturated level at the interface between the gate insulating film and the substrate.

In the MOS capacitor type semiconductor device according to the invention, the source-drain distance and the distance between the back gate and the gate electrode are determined so that electrons or holes can be accumulated at the interface between the gate insulating film and the substrate within a cycle of a frequency superposed to the applied voltage.

In this way, when the charge between the source/drain region and the gate electrode, and between the back gate and the gate electrode is adjusted while the operating frequency is high, the moving distance is shorter, and electrons or holes do not reach the end of the gate, the potential can be prevented from being inverted. Therefore, the device can be operated at high frequencies.

More specifically, the MOS capacitor type semiconductor device according to the invention includes a gate electrode formed on a surface of a substrate through a gate insulating film, source/drain regions provided to have the gate electrode between them, and a back gate having a contact diffusion region for contacting the substrate. Voltage applied between the source or drain region and the gate electrode or between the gate electrode and the back gate is adjusted, so that charge accumulated at the gate insulating film can be adjusted. The source-drain distance or the distance between the back gate and the gate electrode is determined so that electrons or holes can be accumulated at the interface between the gate insulating film and the substrate within a cycle of a frequency superposed to the applied voltage.

In this way, if the moving distance is shorter at high frequencies, and electrons or holes do not reach to the end of the gate, the potential can be prevented from being inverted, so that the device can be operated at high frequencies.

Furthermore, in the MOS capacitor type semiconductor device according to the invention, the source-drain distance $L_{SD}$ is set to satisfy the following expression (1) determined based on a frequency for use:

$$L_{SD}<Ln, \text{ when } Ln=\text{sqrt}(Dn \times \tau_n) \tag{1}$$

where Ln is the moving distance of electrons within a cycle, Dn is the diffusion coefficient of electrons, and $\tau_n$ is a cycle of a frequency for use [s].

In this way, when the source-drain distance $L_{SD}$ is smaller than the distance Ln for which electrons move within a cycle based on the potential difference between the source/drain and the gate, and electrons do not reach the end of the gate, the potential can be prevented from being inverted, so that the device can be operated at high frequencies.

In addition, in the MOS capacitor type semiconductor device according the invention, the back gate-gate distance $L_{BG}$ is set to satisfy the following expression (2) determined based on a frequency for use:

$$L_{BG}<Ln, \text{ when } Wp=\text{sqrt}(Dn \times \tau_n) \tag{2}$$

where Wp is the moving distance of holes within a cycle, Dp is the diffusion coefficient of holes, and $\tau_p$ is a cycle of a frequency for use.

In this way, if the source-drain distance $L_{SD}$ is smaller than the distance Ln for which electrons move within a cycle based on the potential difference between the source/drain and the gate, and holes do not reach the end of the gate, the potential can be prevented from being inverted, so that the device can be operated at high frequencies.

Furthermore, in the MOS capacitor type semiconductor device according to the invention, the source-drain distance $L_{SD}$ and the distance $L_{BG}$ between the gate electrode and the back gate are set to satisfy the following expressions (1) and (2):

$$L_{SD}<Ln, \text{ when } Ln=\text{sqrt}(Dn \times \tau_n) \tag{1}$$

where Ln is the moving distance of electrons within a cycle, Dn is the diffusion coefficient of electrons, $\tau_n$ is a cycle of a frequency for use [s] and $$L_{BG} < Ln, \text{ when } Wp\text{sqrt}(Dn \times \tau_n) \quad (2)$$

where Wp is the moving distance of holes within a cycle, Dp is the diffusion coefficient of holes, and $\tau_p$ is a cycle of a frequency for use [s].

In the MOS capacitor type semiconductor device according to the invention, the gate electrode is arranged in an H shape.

In this way, the arrangement of the back gate can be more flexible, which makes designing easier.

In the MOS capacitor type semiconductor device according to the invention, the gate electrode is arranged in a cross shape.

In this way, the area of the source/drain regions is more reduced, and therefore the width of frequency variation as the oscillation device can be increased.

In the MOS capacitor type semiconductor device according to the invention, a substrate contact forming the back gate is provided so that the source-drain distance $L_{SD}$ and the back gate-gate distance $L_{BG}$ are so set that the source/drain regions are provided in the circle whose radius equals the distance Ln from the center of the gate electrode determined according to expression (1) defined based on the frequency for use, and the back gate is provided in the circle whose radius equals the distance Wp determined according to expression (2) defined based on the frequency for use.

In the MOS capacitor type semiconductor device according to the invention, the center of the gate electrode is located in the center of the gravity of the gate electrode.

In this way, a device that does not suffer from mask misplacement can be formed.

The MOS capacitor type semiconductor device according to the invention is formed in a well formed on a surface of the substrate and isolated from the substrate.

In this way, the back gate potential can be fixed at a potential different from the reference potential, and the back gate potential is connected to the source or drain, so that the change amount can be increased.

A crystal oscillation device according to the invention uses the above-described MOS capacitor type semiconductor device as a load capacitor. The load capacitance for the crystal oscillator is rendered variable, so that the frequency is variable, and a control potential is provided to the gate electrode, drain, or source of the MOS capacitor type semiconductor device as a load capacitance, so that the potential difference is controlled to allow the capacitance to be variable.

In this way, the width of capacitance variation of the MOS capacitor type semiconductor device can be increased and the width of frequency variation can be increased.

In the crystal oscillation device according to the invention, the MOS capacitor type semiconductor device is employed as a unit device, and at least two such devices are provided to form a MOS capacitor.

In this way, a plurality of elements are independently controlled, so that the width of how much capacitance to control can be increased.

In the crystal oscillation device according to the invention, the MOS semiconductor devices are diagonally provided so that the center of gravity is positioned between the two elements.

In this way, size errors if any can easily be absorbed, which can reduce erroneous operation.

At high operating frequencies, the moving distance of electrons or holes injected from electrode terminals is too short for the carriers to reach the interface, and therefore the L dependency and W dependency are observed. In the semiconductor device according to the invention, in order to secure enough capacitance between electrodes for use, the source, drain, and back gate in part or in whole can be provided within a prescribed distance from the gate electrode. In this way, a MOS capacitor type semiconductor device free from the problems regarding the width of frequency change is provided.

DETAILED DESCRIPTION OF THE PREFERRED EMBODIMENTS

Embodiments of the invention will be described in detail in conjunction with the accompanying drawings.

First Embodiment

Figure 1:
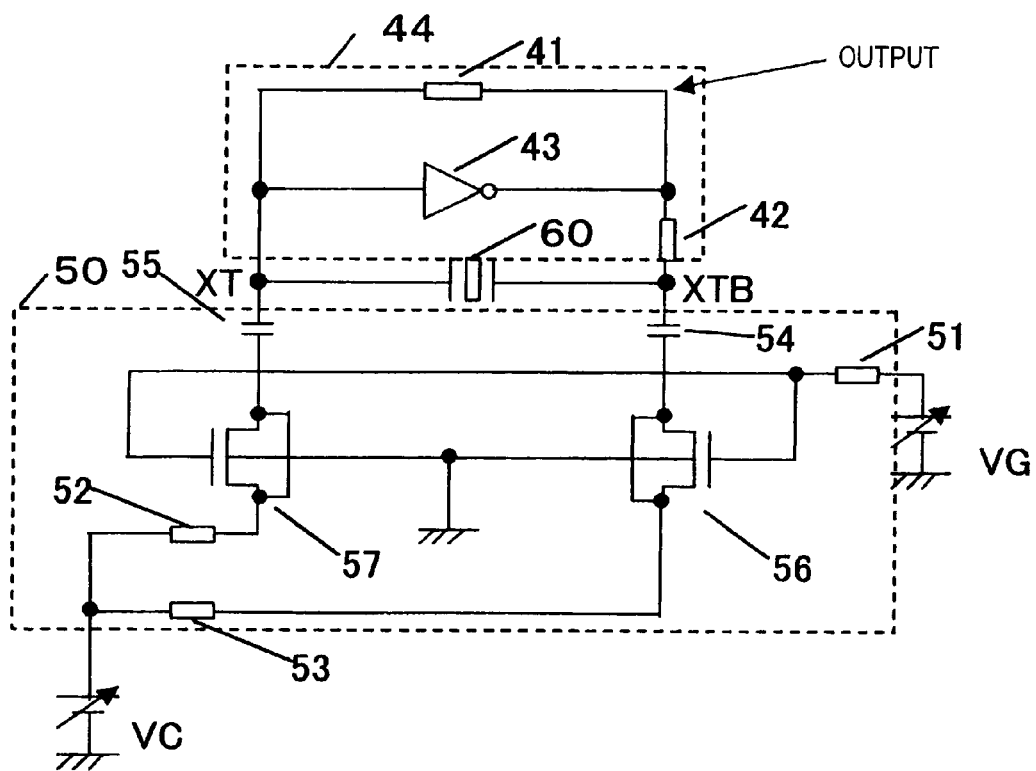
FIG. 1 is an equivalent circuit diagram of a crystal oscillation circuit using MOS capacitor type semiconductor devices according to a first embodiment of the invention.

FIG. 1 is a diagram of the configuration of a crystal oscillation circuit using a MOS capacitor type semiconductor device according to a first embodiment of the invention. The crystal oscillation circuit includes an oscillation circuit portion 44, a crystal oscillator 60, and a load capacitor portion 50. According to the first embodiment, the MOS capacitor type semiconductor devices 56 and 57 forming the load capacitor portion 50 have their sources, drains, and back gates provided within a prescribed distance from the center of the gate electrodes defined by the cycle of the frequency for use. In this way, the moving distance of electrons or holes injected from the electrode terminals are not too short for the carriers to reach the interface. Note that the load capacitor portion 50 includes the MOS capacitor type semiconductor devices 56 and 57, resistors 51 to 53, the capacitors 54 and 55. The oscillation circuit portion 44 includes an inverter transistor 43, a feedback resistor 41, and a limiting resistor 42.

Figure 2:
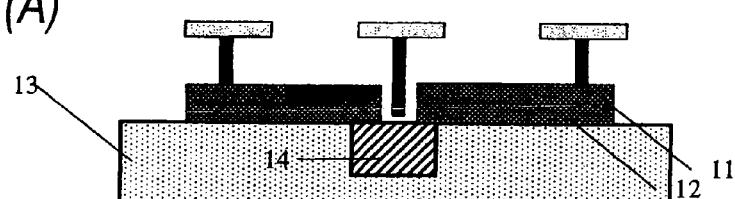
FIGS. 2A to 2D are views of the MOS capacitor type semiconductor device according to the first embodiment.
Figure 2:
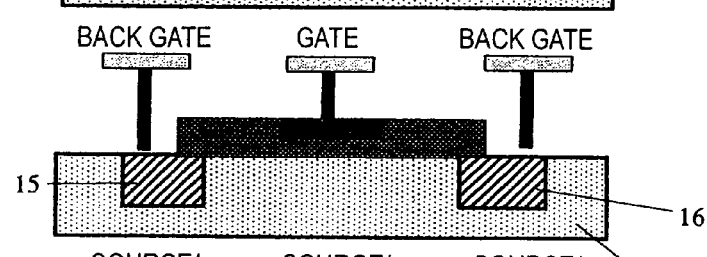
Figure 2:
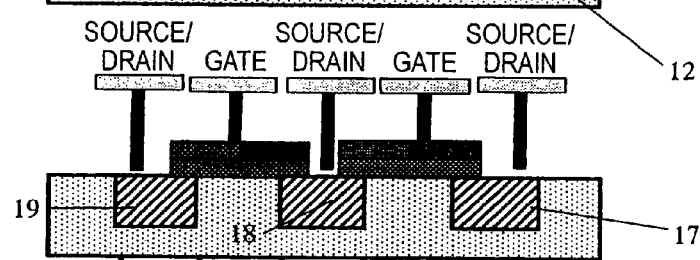
Figure 2:
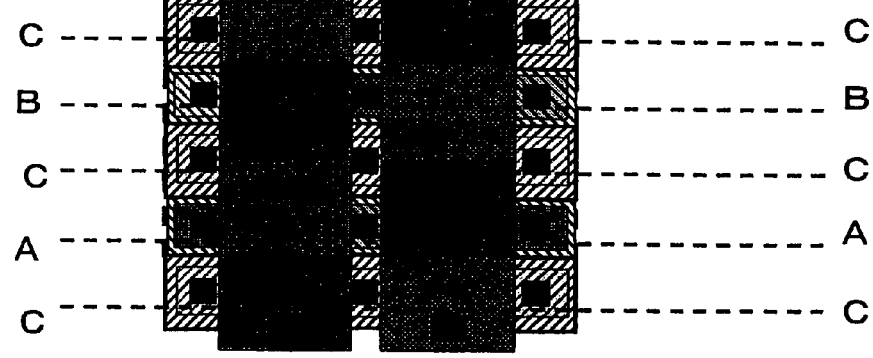

The MOS capacitor type semiconductor device according to the first embodiment shown in FIG. 1 is also shown in FIGS. 2A to 2D. FIGS. 2A to 2C are sectional views taken along lines A-A, B-B, and C-C, respectively in FIG. 2D. FIG. 2D is a top view thereof. In the MOS capacitor type semiconductor device, the gate electrode 11 is made of polysilicon formed on the silicon substrate 13 with a gate oxide film 12 therebetween. Back gates 14, 15, and 16 are made of P-type diffusion layers produced by diffusing P-type semiconductor having a high concentration in a P-well 13 produced by diffusing P-type semiconductor in the surface of the N type silicon substrate 13. The drain/source regions 17, 18, and 19 are made of N-type semiconductor layers produced by diffusing N type semiconductor in the P-well 13.

According to the first embodiment of the invention, in order to secure sufficient capacitance between the electrodes, the source-drain distance $L_{SD}$ and the back gate-gate distance $L_{BG}$ are set to satisfy the following expressions (1) and (2) defined based on the frequency for use. In practice, the source/drain regions 17, 18, and 19 are provided in the circle whose radius equals the distance Wp determined according to expression (1) based on the frequency for use and the P-type diffusion layers 14, 15, and 16 forming the back gates are provided in the circle whose radius equals the distance Ln determined according to expression (2) based on the frequency for use.

The moving distance of electrons in one cycle:
$$Ln = \sqrt{Dn \times \tau_n} \quad (1)$$

where Dn is the diffusion coefficient of electrons, and $\tau_n$ is the cycle of the frequency for use [s].

The moving distance of holes in one cycle:
$$Wp \sqrt{Dp \times \tau_p} \quad (2)$$

where Dn is the diffusion coefficient of holes, and $\tau_p$ is the cycle of the frequency for use [s].

According to the embodiment, the gate electrodes are arranged in an H shape.

In this way, a semiconductor device is provided that allows electrons and holes to reach the gate within a cycle and the charge to be accumulated at the gate insulating film, so that a desired width of capacitance change can be maintained in response to the width of frequency change.

In this case, the N-type diffusion layers 17, 18, and 19 as the source/drain regions and the P-type diffusion layers 14, 15, and 16 as the back gates are all provided in the circles whose radiuses are the distances Ln and Wp, respectively defined according to expressions (1) and (2).

Note that desirably these layers are entirely provided within the circles whose radiuses are distances Ln and Wp defined by expressions (1) and (2), but they need be within the circles at least by half.

The invention is applicable not only to NMOS devices but also to PMOS devices. For the PMOS device, the conductivity is reversed, and therefore expressions (1) and (2) representing the moving distance of electrons and holes within a cycle are reversely applied.

Second Embodiment

According to the first embodiment, the gate electrode is arranged in an H shape, and the source-drain distance $L_{SD}$ and the back gate-gate distance $L_{BG}$ are within the moving distance. Meanwhile, according to the second embodiment, the gate electrode is arranged in a cross shape, so that the source-drain distance $L_{SD}$ and the back gate-gate distance $L_{BG}$ are within the moving distance.

Figure 3:
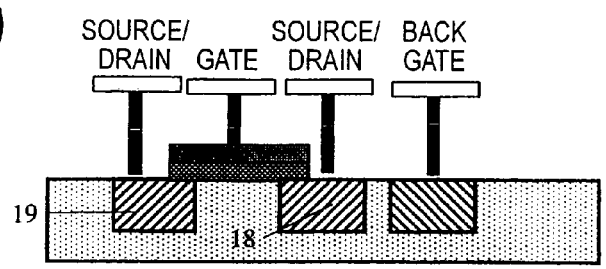
FIGS. 3A and 3C are views of a MOS capacitor type semiconductor device according to a second embodiment of the invention.
Figure 3:
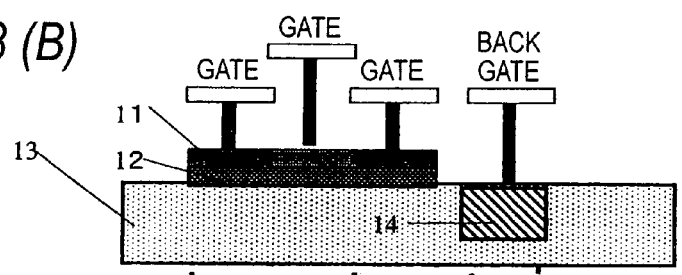
Figure 3:
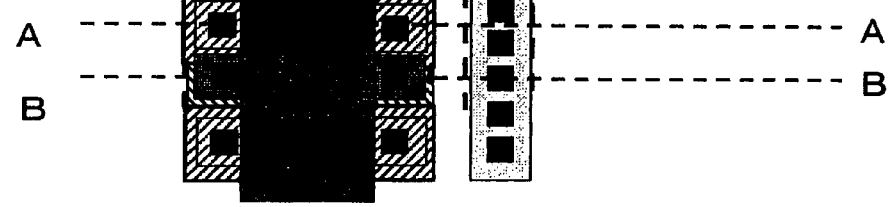

The MOS capacitor type semiconductor device according to the second embodiment is shown in FIGS. 3A to 3C. FIGS. 3A and 3B are sectional views taken along lines A-A and B-B, respectively in FIG. 3C. FIG. 3C is a top view thereof. In the MOS capacitor type semiconductor device, the gate electrode 11 is made of polysilicon formed on the silicon substrate 13 through the gate oxide film 12, and the back gate 14 is made of a P-type diffusion layer produced by diffusing P-type semiconductor having a high concentration into a P-well 13 produced by diffusing P-type semiconductor into the surface of the N-type silicon substrate 13. The drain/source regions 18 and 19 are made of N-type semiconductor layers produced by diffusing N-type semiconductor in the P-well 13.

According to the second embodiment, in order to secure necessary capacitance between the electrodes for use, the source-drain distance $L_{SD}$ and the back gate-gate distance $L_{BG}$ are set to satisfy expressions (1) and (2) defined based on the frequency for use. In practice, the source/drain regions 18 and 19 are provided in the circle whose radius equals the distance Wp from the center of the gate electrode 11 determined according to expression (1) defined based on the frequency for use and the P-type diffusion layer 14 forming the back gate is provided in the circle whose radius equals the distance $L_n$ determined according to expression (2) defined based on the frequency for use.

In this way, a semiconductor device is provided that allows electrons and holes to reach the gate within a cycle and the charge to be accumulated at the gate insulating film, so that a desired width of capacitance change can be maintained in response to the width of frequency change.

Third Embodiment

According to the previously described embodiments, the gate electrode is arranged in a cross or H shape, so that the source-drain distance $L_{SD}$ and the back gate-gate distance $L_{BG}$ are within the moving distance. According to a third embodiment, only capacitance change between the gate and the source/drain region is used, so that the source-drain distance $L_{SD}$ is within the moving distance.

Figure 4:
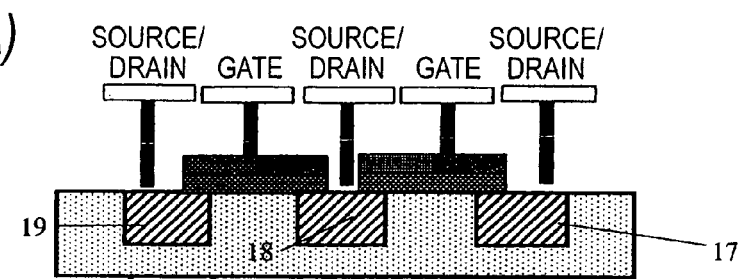
FIGS. 4A and 4B are views of a MOS capacitor type semiconductor device according to a third embodiment of the invention.
Figure 4:
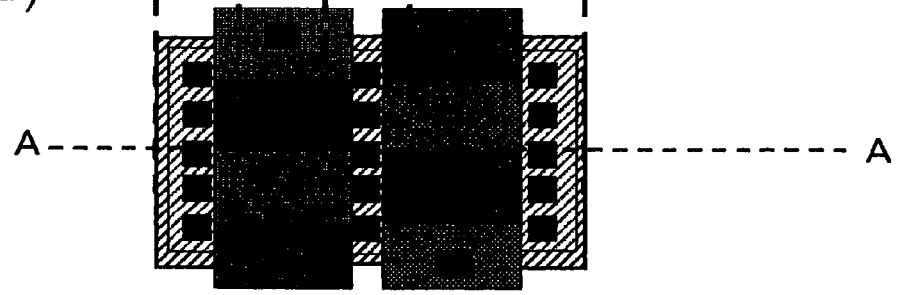

The MOS capacitor type semiconductor device according to the third embodiment is shown in FIGS. 4A and 4B. FIG. 4A is a sectional view taken along line A-A in FIG. 4B and FIG. 4B is a top view thereof. Similarly to the first and second embodiments, in the MOS capacitor type semiconductor device, the gate electrode 11 is made of polysilicon formed on the silicon substrate 13 through the gate oxide film 12, and the source/drain regions 15 and 16 are made of P-type semiconductor layers produced by diffusing P-type semiconductor in the P-well 13.

According to the third embodiment, in order to secure necessary capacitance between the electrodes for use, the source-drain distance $L_{SD}$ is set to satisfy expression (1) defined based on the frequency for use. In practice, the source/drain regions 18 and 19 are provided in the circle whose radius equals the distance Wp from the center of the gate electrode 11 determined according to expression (1) defined based on the frequency for use.

In this way, a semiconductor device is provided that allows electrons to reach the gate within a cycle and the charge to be accumulated at the gate insulating film, so that a desired width of capacitance change can be maintained in response to the width of frequency change. The voltage across the region between the gate and source/drain regions can be increased, while the capacitance can be changed from a small amount to a large amount.

Fourth Embodiment

According to the third embodiment, the source-drain distance $L_{SD}$ is within the moving distance, while according to a fourth embodiment, only capacitance change caused by controlling voltage applied across the region between the back gate and the gate is used, so that the back gate-gate distance $L_{BG}$ is set within the moving range described above.

Figure 5:
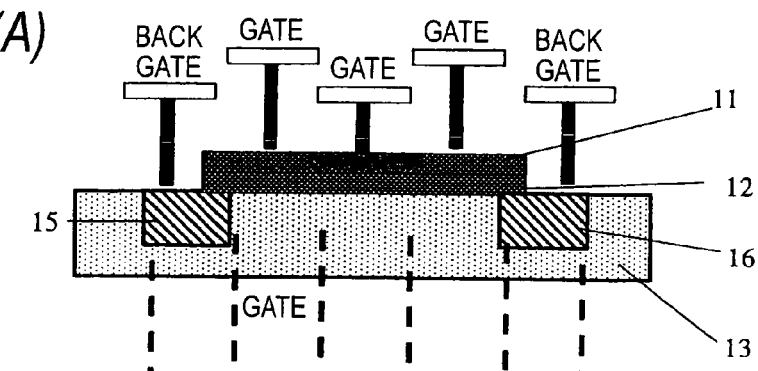
FIGS. 5A and 5B are views of a MOS capacitor type semiconductor device according to a fourth embodiment of the invention.
Figure 5:
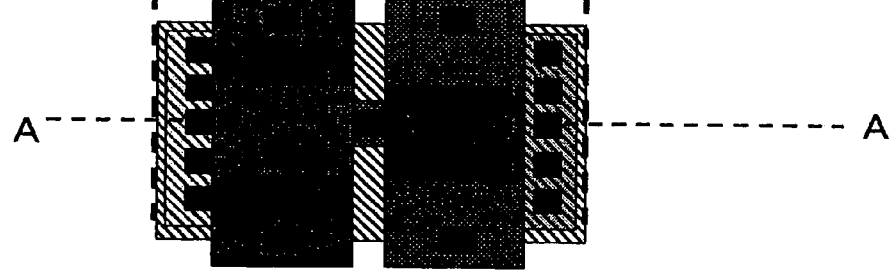

The MOS capacitor type semiconductor device according to the fourth embodiment is shown in FIGS. 5A and 5B. FIG. 5A is a sectional view taken along line A-A in FIG. 5B and FIG. 5B is a top view thereof. Similarly to the first to third embodiments, in the MOS capacitor type semiconductor device, the gate electrode 11 is made of polysilicon formed on the silicon substrate 13 through the gate oxide film 12, and the back gate 14 is made of an N-type semiconductor layer produced by diffusing N-type semiconductor into the P-well 13.

According to the fourth embodiment, in order to secure necessary capacitance between the electrodes, the back gate-gate distance $L_{BG}$ is set to satisfy expression (2) defined based on the frequency for use. In practice, the P-type diffusion region 14 for the back gate is provided in the circle whose radius equals the distance Ln from the center of the gate electrode 11 determined according to expression (2) defined based on the frequency for use.

In this way, a semiconductor device is provided that allows holes to reach the gate within a cycle and the charge to be accumulated at the gate insulating film, so that a desired width of capacitance change can be maintained in response to the width of frequency change. The voltage across the region between the gate and back gate can be increased, while the capacitance can be changed from a large amount to a small amount.

According to the embodiment, the gate electrode is arranged in an H shape.

Fifth Embodiment

According to the fourth embodiment, the back gate-gate distance $L_{BG}$ is set within the moving distance, and this also applies to a fifth embodiment. The gate electrode has outward projections from its H-shaped arrangement, and the back gate-gate distance $L_{BG}$ is set within the moving distance.

Figure 6:
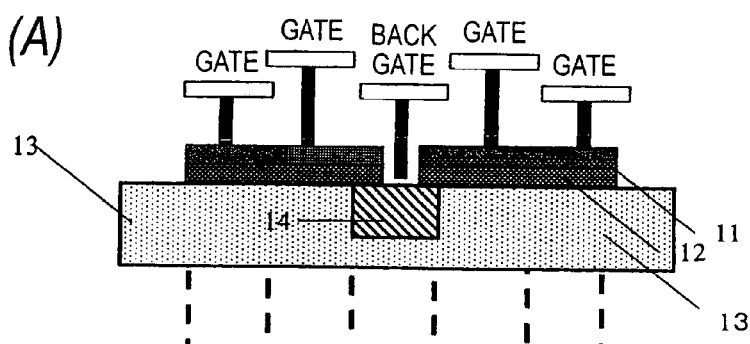
FIGS. 6A and 6B are views of a MOS capacitor type semiconductor device according to a fifth embodiment of the invention.
Figure 6:
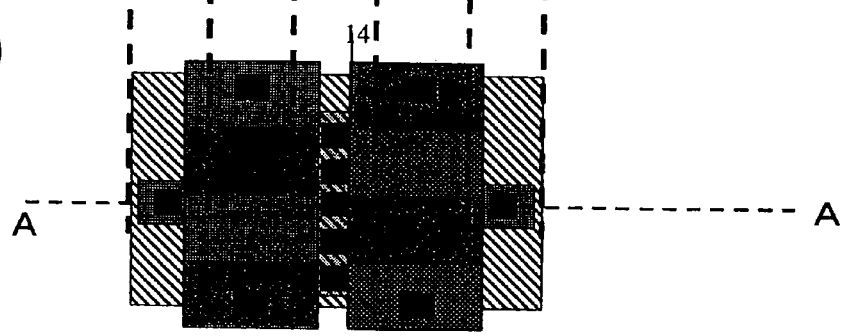

The MOS capacitor type semiconductor device according to the fifth embodiment is shown in FIGS. 6A and 6B. FIG. 6A is a sectional view taken along line A-A in FIG. 6B and FIG. 6B is a top view thereof. Similarly to the first to fourth embodiments, in the MOS capacitor type semiconductor device, the gate electrode 11 is made of polysilicon formed on the silicon substrate 13 through the gate oxide film 12, and the back gate 14 is made of an N-type semiconductor layer produced by diffusing N-type semiconductor into the P-well 13.

According to the fifth embodiment, in order to secure necessary capacitance between the electrodes for use, the back gate-gate distance $L_{BG}$ is set to satisfy expression (2) defined based on the frequency for use. In practice, the P-type diffusion region 14 for the back gate is provided in the circle whose radius equals the distance Ln from the center of the gate electrode 11 determined according to expression (2) defined based on the frequency for use.

In this way, similarly to the fourth embodiment, a semiconductor device is provided that allows holes to reach the gate within a cycle and the charge to be accumulated at the gate insulating film, so that a desired width of capacitance change can be maintained in response to the width of frequency change. The voltage across the region between the gate and the back gate can be increased, while the capacitance can be changed from a large amount to a small amount.

Sixth Embodiment

Figure 7:
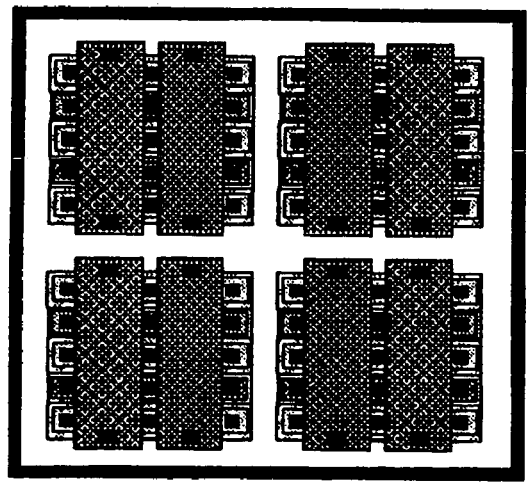
FIGS. 7 to 9 are views of MOS capacitor type semiconductor devices according to sixth to eighth embodiments of the invention.

FIG. 7 shows a layout of a MOS capacitor type semiconductor device according to a sixth embodiment of the invention.

In this example, the MOS capacitor type semiconductor device according to any of the first to fifth embodiments is provided as a unit device, and four such devices are used to form a load capacitor.

In this way, operation at even higher frequencies is enabled.

Seventh Embodiment

Figure 8:
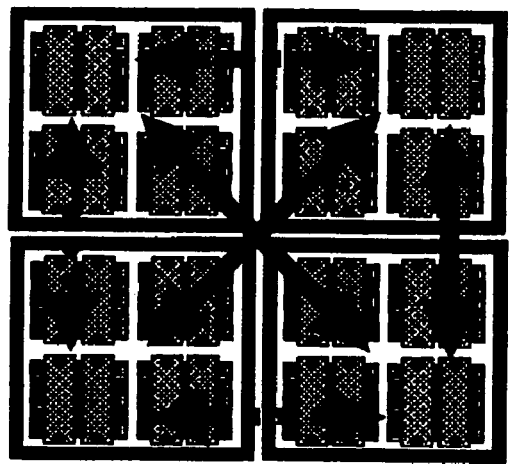

FIG. 8 shows an arrangement of two or more MOS capacitor type semiconductor devices according to the first to fifth embodiments, in which the two devices are diagonally provided with the center of gravity positioned between them, and such devices are provided relatively in the vertical and diagonal directions in the top view.

In this arrangement, errors caused in the process can be absorbed, so that deviations in the capacitance values of the semiconductor devices can be reduced, and even more precise capacitance values can be obtained.

Eighth Embodiment

Figure 9:
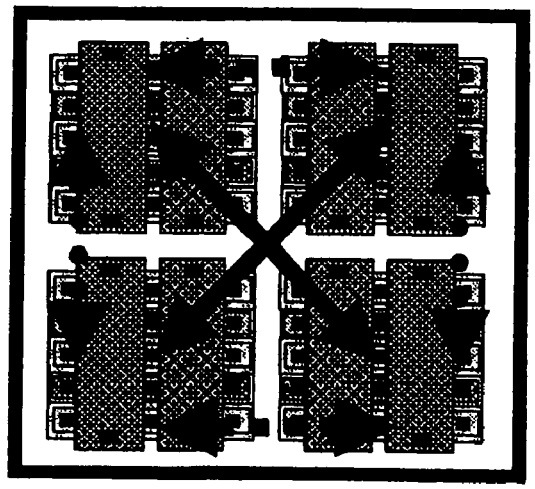
Figure 10:
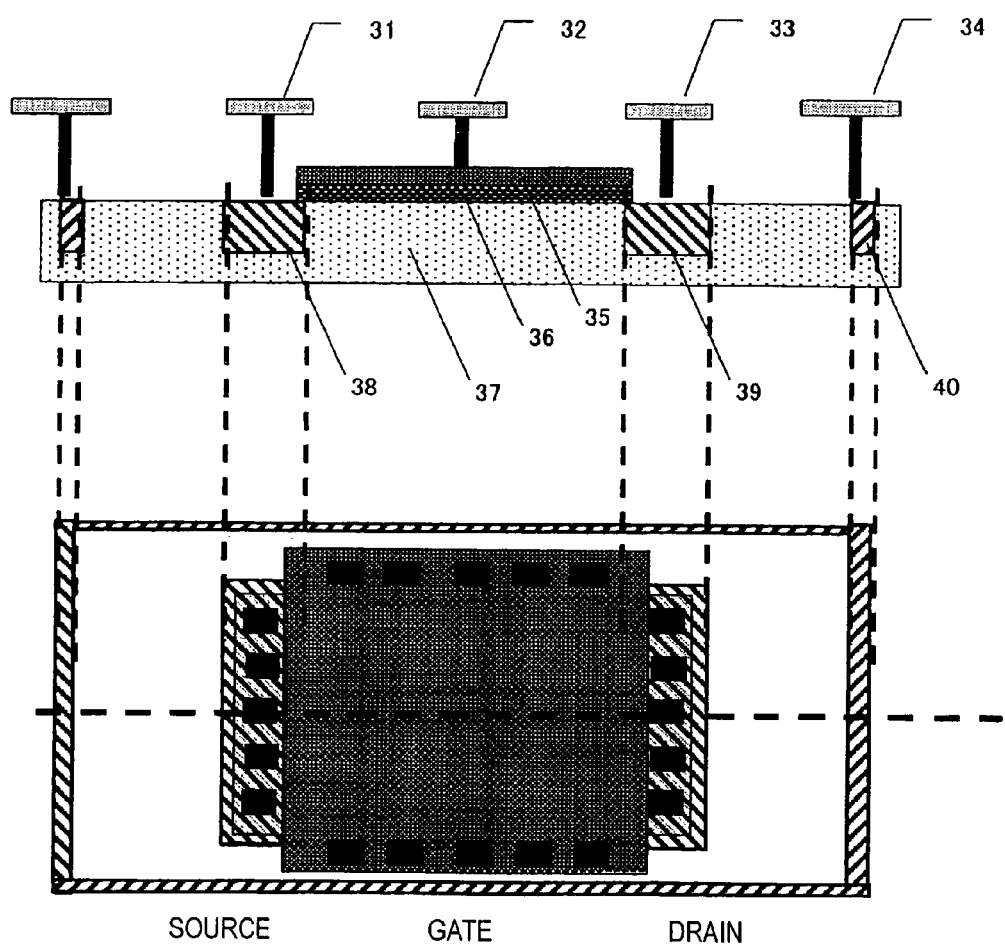
FIG. 10 is a sectional view of a conventional device structure.
Figure 11:
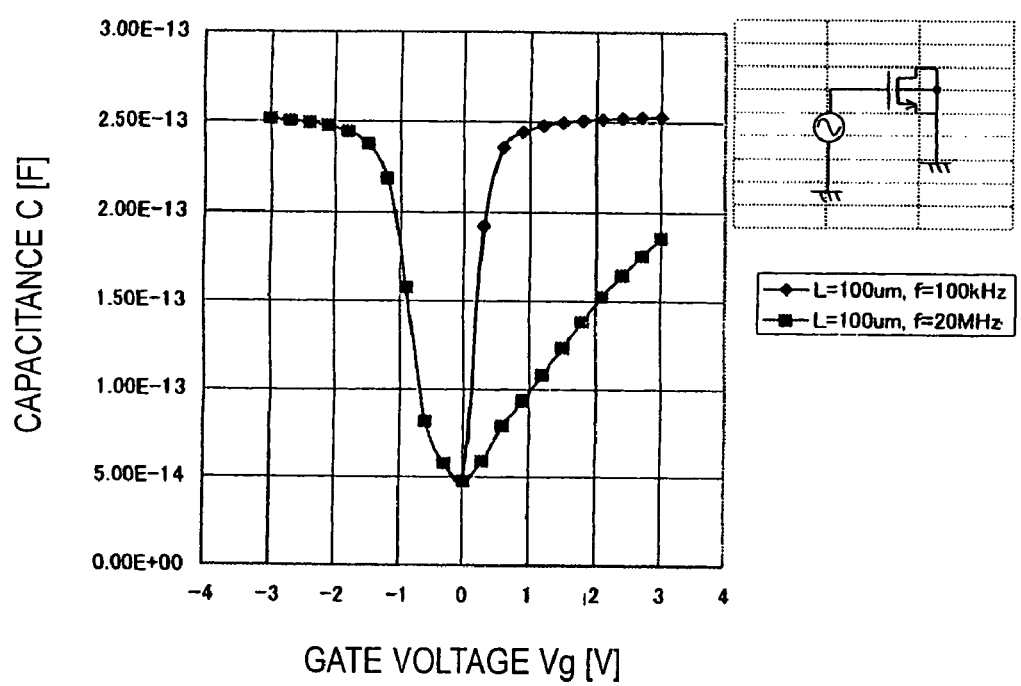
FIG. 11 is a graph representing the relation between applied voltage and gate-source capacitance.
Figure 12:
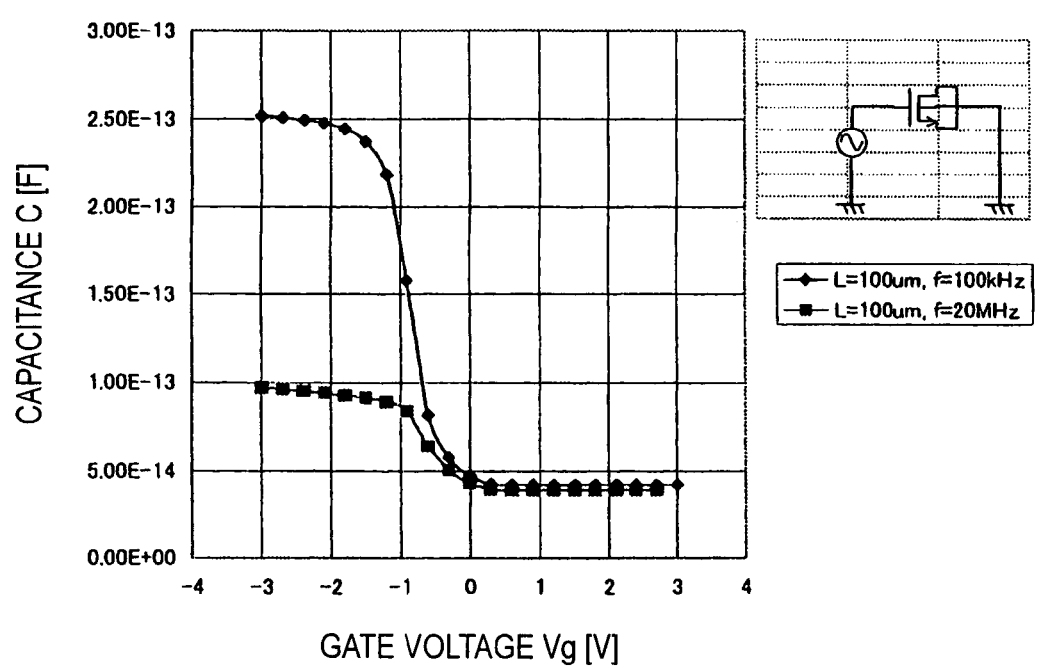
FIG. 12 is a graph representing the relation between applied voltage and gate-back gate capacitance.

FIG. 9 shows an arrangement of two or more blocks each including the MOS structure according to any of the first to fifth embodiments, in which the center of gravity is positioned between the two blocks, and the blocks are provided diagonally and relatively in the vertical and diagonal directions in the top view.

In this arrangement, deviations in the capacitance values of the semiconductor devices can be reduced, and even more precise capacitance values can be provided.

The semiconductor device according to the invention is applicable as a high frequency MOS capacitor type semiconductor device that allows its capacitance to be adjusted highly precisely in a high frequency band.

What is claimed is:

1. A MOS capacitor type semiconductor device, comprising:
   a gate electrode, formed on a surface of a substrate through a gate insulating film;
   source/drain regions, provided to have the gate electrode between them; and
   a back gate having a contact diffusion region for contacting the substrate;
   wherein voltage is applied between the source/drain region and the gate electrode or between the gate electrode and the back gate being adjusted so that charge accumulated at the gate insulating film can be adjusted; and
   the distance between the source and drain regions or the distance between the back gate and the gate electrode is determined so that electrons or holes can be accumulated at the interface between the gate insulating film and the substrate within a cycle of a frequency superposed to the applied voltage.

2. The MOS capacitor type semiconductor device, according to claim 1, wherein the source-drain distance and the distance between the back gate and the gate electrode are determined so that electrons or holes can be accumulated at the interface between the gate insulating film and the substrate within a cycle of a frequency superposed to the applied voltage.

3. The MOS capacitor type semiconductor device according to claim 2, wherein the source-drain distance $L_{SD}$ and the distance $L_{BG}$ between the back gate and the gate electrode are set to satisfy the following expressions (1) and (2):

$$L_{SD}<Ln, \text{ when } Ln=\text{sqrt}(Dn\times\tau_n) \quad (1)$$

where Ln is the moving distance of electrons, Dn is the diffusion coefficient of electrons, $\tau_n$ is a cycle of a frequency for use [s] and $$L_{BG}<Ln, \text{ when } Wp\text{sqrt}(Dn\times\tau_n) \quad (2)$$

where Wp is the moving distance of holes, Dp is the diffusion coefficient of holes, and $\tau_p$ is a cycle of a frequency for use [s].

4. The MOS capacitor type semiconductor device according to claim 3, wherein a substrate contact forming the back gate is provided so that the source-drain distance $L_{SD}$ and the distance $L_{BG}$ between the back gate and the gate electrode are so set that the source/drain regions are provided in the circle whose radius equals the distance Ln from the center of the gate electrode determined according to expression (1) defined based on a frequency for use, and the back gate is provided in the circle whose radius equals the distance Wp determined according to expression (2) defined based on a frequency for use.

5. The MOS capacitor type semiconductor device according to claim 4, wherein the center of the gate electrode is located in the center of the gravity of the gate electrode.

6. The MOS capacitor type semiconductor device according to claim 1, wherein the source-drain distance $I_{SD}$ is set to satisfy the following expression (1) determined based on a frequency for use:

$$L_{SD}<Ln, \text{ when } Ln=\text{sqrt}(Dn\times\tau_n) \quad (1)$$

where Ln is the moving distance of electrons, Dn is the diffusion coefficient of electrons, and In is a cycle of a frequency for use [s].

7. The MOS capacitor type semiconductor device according to claim 1, wherein the distance $L_{BG}$ between the back gate and the gate electrode is set to satisfy the following expression (2) determined based on a frequency for use:

$$L_{BG}<Ln, \text{ when } Wp\text{sqrt}(Dn\times\tau_n) \quad (2)$$

where Wp is the moving distance of holes, Dp is the diffusion coefficient of holes, and $\tau_p$ is a cycle of a frequency for use [s].

8. The MOS capacitor type semiconductor device according to claim 1, wherein the gate electrode is arranged in an H shape.

9. The MOS capacitor type semiconductor device according to claim 1, wherein the gate electrode is arranged in a cross shape.

10. The MOS capacitor type semiconductor device according to claim 1 being formed in a well formed on a surface of the substrate and isolated from the substrate.

11. A crystal oscillation device that uses a MOS capacitor type semiconductor device according to claim 1 as a load capacitor, wherein the load capacitance for the crystal oscillator is variable, so that the frequency is rendered variable, and a control potential is provided to the gate electrode, drain, or source of the MOS capacitor type semiconductor device as a load capacitance, so that the potential difference is controlled to allow the capacitance to be variable.

12. The crystal oscillation device according to claim 11, wherein the MOS capacitor type semiconductor device is employed as a unit device, and at least two the devices are provided to form a MOS capacitor.

13. The crystal oscillation device according to claim 12, wherein the MOS semiconductor devices are diagonally provided so that the center of gravity is positioned between the two devices.

* * * * *